(12) United States Patent
Yang et al.

(10) Patent No.: US 12,140,386 B2
(45) Date of Patent: Nov. 12, 2024

(54) HEAT-DISSIPATING SUBSTRATE STRUCTURE

(71) Applicant: AMULAIRE THERMAL TECHNOLOGY, INC., New Taipei (TW)

(72) Inventors: Ching-Ming Yang, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 227 days.

(21) Appl. No.: 17/903,993

(22) Filed: Sep. 6, 2022

(65) Prior Publication Data

US 2023/0009424 A1    Jan. 12, 2023

Related U.S. Application Data

(63) Continuation-in-part of application No. 17/368,836, filed on Jul. 7, 2021, now abandoned.

(51) Int. Cl.
*F28F 21/08* (2006.01)
*B32B 15/01* (2006.01)
*F28F 3/12* (2006.01)

(52) U.S. Cl.
CPC .......... *F28F 21/089* (2013.01); *B32B 15/017* (2013.01); *F28F 3/12* (2013.01); *F28F 21/084* (2013.01); *B32B 2307/72* (2013.01); *B32B 2307/732* (2013.01)

(58) Field of Classification Search
None
See application file for complete search history.

(56) References Cited

U.S. PATENT DOCUMENTS

| 2014/0226284 A1* | 8/2014 | Yamauchi | F28D 15/02 |
| | | | 29/890.032 |
| 2019/0329906 A1* | 10/2019 | Cawthorne | B64C 11/205 |

FOREIGN PATENT DOCUMENTS

| CN | 111893479 A | 11/2020 |
| TW | 201330761 A1 | 7/2013 |
| TW | 201701984 A | 1/2017 |
| WO | WO2020013333 A1 | 1/2020 |

* cited by examiner

*Primary Examiner* — Daniel J. Schleis
(74) *Attorney, Agent, or Firm* — Li & Cai Intellectual Property Office

(57) ABSTRACT

The heat-dissipating substrate structure includes a base layer and a cold spray coating layer. The cold spray coating layer is formed on a surface of the base layer. The cold spray coating layer is a film formed on the surface of the base layer by spraying a solid-phase metal powder and a high-pressure compressed gas onto the base layer. The solid-phase metal powder at least includes a film-forming powder with an apparent density of 3 to 4 g/cm³ and a median particle diameter (D50) of 30 μm or less. A maximum depth of a bottom of the cold spray coating layer embedded in the base layer is less than 60 μm. A cooler contains an internal cooling fin joined to the base layer. An internal coolant passage is defined between the base layer, the internal cooling fin, and an interior of the cooler.

6 Claims, 3 Drawing Sheets

HEAT-DISSIPATING SUBSTRATE STRUCTURE

CROSS-REFERENCE TO RELATED PATENT APPLICATION

This Application is a Continuation-in-Part of application Ser. No. 17/368,836 filed Jul. 7, 2021, now pending, and entitled "HEAT-DISSIPATING SUBSTRATE STRUCTURE AND METHOD FOR MANUFACTURING THE SAME," the entire disclosures of which are incorporated herein by reference.

FIELD OF THE DISCLOSURE

The present disclosure relates to a substrate structure, and more particularly to a heat-dissipating substrate structure.

BACKGROUND OF THE DISCLOSURE

Cold spray coating layers formed by spraying a solid-phase metal powder and a low-pressure compressed gas onto surfaces of heat-dissipating substrates have a low bonding strength to the heat-dissipating substrate because the metal powder is in a solid-phase. Furthermore, cold spray coating layers formed by spraying the solid-phase metal powder and a high-pressure compressed gas onto the surfaces of the heat-dissipating substrates have portions thereof deeply embedded in the heat-dissipating substrate due to high-pressure spraying, and complex, diverse, and unpredictable microstructures or cracks are prone to be formed therein.

SUMMARY OF THE DISCLOSURE

In response to the above-referenced technical inadequacies, the present disclosure provides a heat-dissipating substrate structure.

In one aspect, the present disclosure provides a heat-dissipating substrate structure which includes a base layer and a cold spray coating layer. The cold spray coating layer is formed on a top surface of the base layer. The cold spray coating layer is a film formed on the top surface of the base layer by spraying a solid-phase metal powder and a high-pressure compressed gas onto the base layer. The solid-phase metal powder at least includes a film-forming powder with an apparent density of 3 to 4 g/cm$^3$ and a median particle diameter (D50) of 30 μm or less. A maximum depth of a bottom of the cold spray coating layer embedded in the base layer is less than 60 μm. A cooler contains at least one internal cooling fin. The at least one internal cooling fin is joined to a bottom surface of the base layer. At least one internal coolant passage is defined between the base layer, the at least one internal cooling fin, and an interior of the cooler.

In certain embodiments, a predetermined ratio between a thickness of the base layer and a thickness of the cold spray coating layer ranges from 10:1 to 30:1.

In certain embodiments, the thickness of the base layer is from 1 mm to 3 mm.

In certain embodiments, the at least one internal cooling fin is joined to the bottom surface of the base layer by brazing, adhesive bonding, or solid-state welding.

In certain embodiments, the cold spray coating layer is a cold spray copper layer.

In certain embodiments, the base layer is an aluminum substrate.

In certain embodiments, the high-pressure compressed gas is a compressed gas with a pressure of 4 to 6 Mpa.

Therefore, in the heat-dissipating substrate structure provided by the present disclosure, by virtue of "the cold spray coating layer being the film formed on the surface of the base layer by spraying the solid-phase metal powder and the high-pressure compressed gas onto the base layer", "the solid-phase metal powder at least including the film-forming powder with the apparent density of 3 to 4 g/cm$^3$ and the median particle diameter (D50) of 30 μm or less", and "the maximum depth of a bottom of the cold spray coating layer embedded in the base layer being 100 μm or less", the bonding strength of the cold spray coating layer and the base layer can reach 40 Mpa or more, and the maximum depth of the bottom of the cold spray coating layer embedded in the base layer is 100 μm or less, such that the depth of the bottom of the cold spray coating layer embedded in the base layer formed by high-pressure spraying on the base layer can be reduced, the bonding strength can still reach 40 Mpa or more, and formation of complex, diverse, and unpredictable microstructures or cracks can be prevented.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
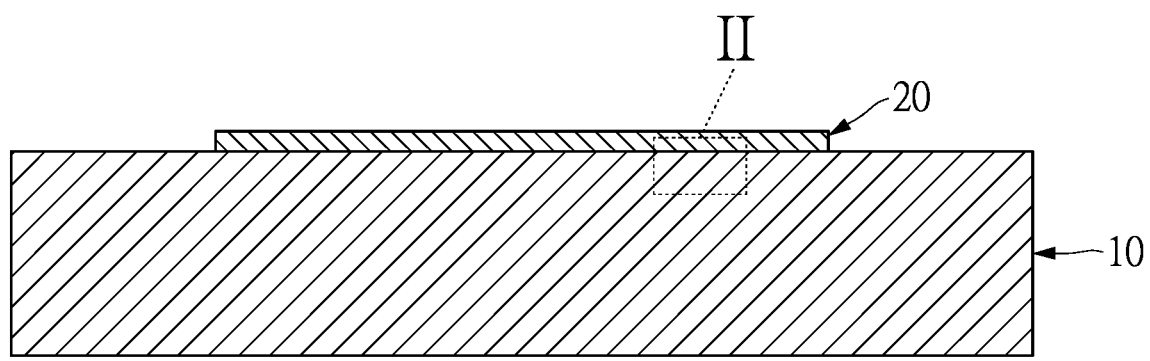
FIG. 1 is a schematic side view of a heat-dissipating substrate structure according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

EMBODIMENTS

Referring to FIG. 1, FIG. 1 is a heat-dissipating substrate structure provided by the present disclosure. As shown in the figure, a heat-dissipating substrate structure according to the present disclosure includes a base layer 10 and a cold spray coating layer 20.

As mentioned above, the cold spray coating layer 20 is formed on the base layer 10. In the present embodiment, the base layer 10 is an aluminum heat-dissipating substrate or an aluminum heat sink, but it is not limited thereto.

In the present embodiment, the cold spray coating layer 20 is a film formed on a top surface of the base layer 10 by spraying a solid-phase metal powder and a high-pressure compressed gas onto the base layer 10. In addition, in the present embodiment, the high-pressure compressed gas is preferably a compressed gas with a pressure of 4 to 6 Mpa.

Moreover, in the present embodiment, the solid-phase metal powder used for forming the cold spray coating layer 20 includes at least a film-forming powder with an apparent density of 3 to 4 g/cm$^3$ and a median particle diameter (D50) of 30 μm or less.

Figure 2:
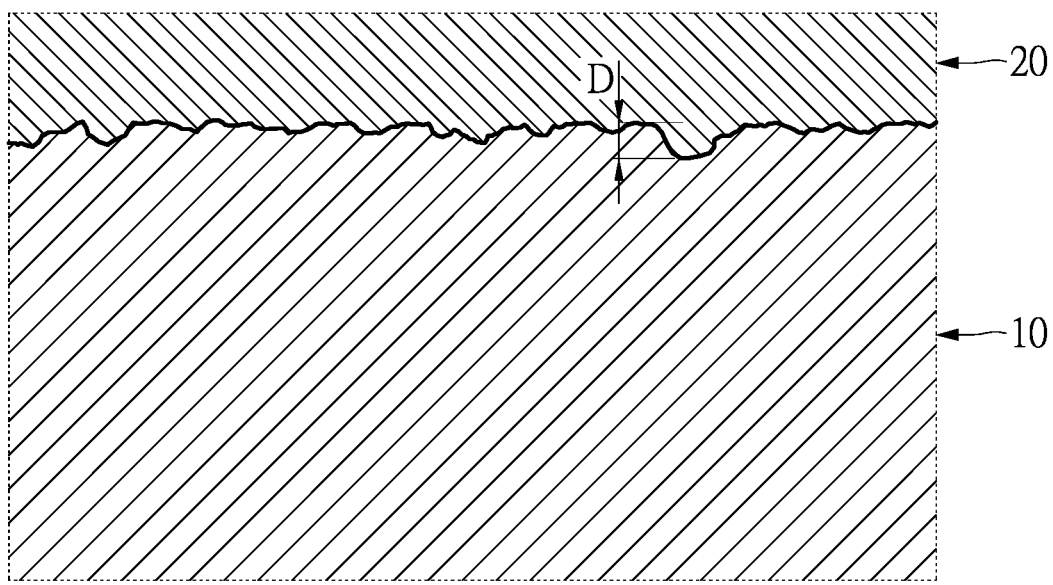
FIG. 2 shows an enlarged view of part II of FIG. 1.

In addition, according to experimental results, when the solid-phase metal powder for forming the cold spray coating layer 20 at least includes the film-forming powder with the apparent density of 3 to 4 g/cm$^3$ and the median particle diameter (D50) of 30 μm or less, and the solid-phase metal powder is sprayed onto the base layer 10 with the high-pressure (being of 4 to 6 Mpa) compressed gas, a bonding strength of the cold spray coating layer 20 and the base layer 10 can reach 40 Mpa or more. In addition, as shown in FIG. 2, a maximum depth D of a bottom of the cold spray coating layer 20 embedded in the base layer 10 is 100 μm or less, and even can be 60 μm or less, so that the depth of the bottom of the cold spray coating layer embedded in the base layer formed by high-pressure spraying on the base layer can be reduced, the bonding strength can still reach 40 Mpa or more, and formation of complex, diverse, and unpredictable microstructures or cracks can be prevented.

In one embodiment, the cold spray coating layer 20 can be a cold spray copper layer. Furthermore, the cold spray copper layer can be a film formed on the top surface of the base layer 10 by spraying a solid-phase copper powder and the high-pressure compressed gas onto the base layer 10.

In one embodiment, the cold spray coating layer 20 can be a cold spray aluminum layer. Furthermore, the cold spray aluminum layer can be a film formed on the top surface of the base layer 10 by spraying a solid-phase aluminum powder and the high-pressure compressed gas onto the base layer 10.

In one embodiment, the cold spray coating layer 20 can be a cold spray nickel layer. Furthermore, the cold spray nickel layer can be a film formed on the top surface of the base layer 10 by spraying a solid-phase nickel powder and the high-pressure compressed gas onto the base layer 10.

In one embodiment, the cold spray coating layer 20 can be a cold spray iron layer. Furthermore, the cold spray iron layer can be a film formed on the top surface of the base layer 10 by spraying a solid-phase iron powder and the high-pressure compressed gas onto the base layer 10.

In one embodiment, the cold spray coating layer 20 can be a cold spray alloy layer. Furthermore, the cold spray alloy layer can be a film formed on the top surface of the base layer 10 by spraying at least two of the solid-phase copper powder, the solid-phase aluminum powder, the solid-phase nickel powder, and the solid-phase iron powder, and the high-pressure compressed gas onto the base layer 10.

According to the above description, the present disclosure also provides a method for manufacturing a heat-dissipation substrate structure, which includes (a) providing a base layer and (b) forming a cold spray coating layer on a surface of the base layer. Specifically, in the present embodiment, the cold spray coating layer is a film formed on a surface of the base layer by spraying a solid-phase metal powder and a high-pressure (being of 4 to 6 Mpa) compressed gas onto the base layer. In addition, the solid-phase metal powder at least includes a film-forming powder with an apparent density of 3 to 4 g/cm$^3$ and a median particle diameter (D50) of 30 μm or less. Moreover, a maximum depth of a bottom of the cold spray coating layer embedded in the base layer is 100 μm or less.

Figure 3:
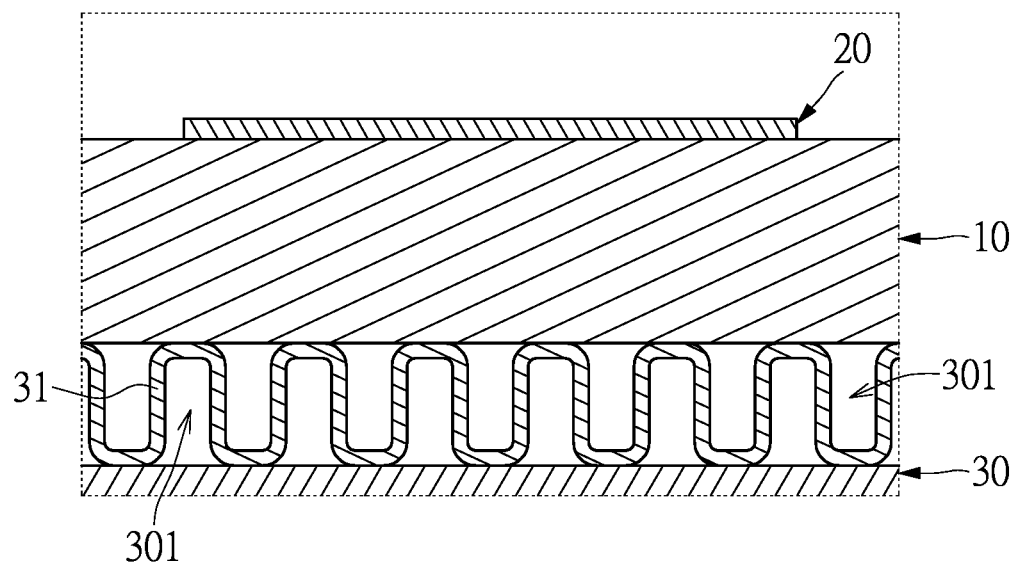
FIG. 3 is a schematic side view of another heat-dissipating substrate structure according to the present disclosure.

In one embodiment, referring to FIG. 3, the base layer 10 can be further integrated with a cooler 30. The cooler 30 can be joined to the bottom of the base layer 10. The cooler 30 can contain an internal cooling fin 31 disposed in the interior thereof. The cooler 30 can also contain more internal cooling fins arranged in parallel. In this embodiment, the internal cooling fin 31 has a series of upper and lower U-shaped bends. However, in other embodiments, other shapes or configurations for the cooling fin may be applicable. The cooling fin 31 can be made of one of copper, copper alloy, aluminum, and aluminum alloy. The cooling fin 31 can also be made of a metal alloy having excellent heat transfer characteristics. The discontinuous top portion of the cooling fin 31 is generally flat, which provides a large area for brazing and assisting in the flow of heat out from base layer 10 into the cooling fin 31. Preferably, the internal cooling fin 31 is brazed to the bottom surface of the base layer 10. The internal cooling fin 31 can also be joined to the bottom surface of the base layer 10 by adhesive bonding or solid-state welding. Further, at least one internal coolant passage 301 is defined between the base layer 10, the at least one internal cooling fin 31, and the interior of the cooler 30, so as to enhance heat dissipation efficiency of the base layer 10.

In order to further enhance heat dissipation efficiency of the base layer 10, the predetermined ratio between the thickness of the base layer 10 and the thickness of the cold spray coating layer 20 ranges from 10:1 to 30:1. Specifically, the thickness of the portion of the base layer 10 beneath the cold spray coating layer 20 is from 1 mm to 3 mm, which is much greater than the maximum depth of the bottom of the cold sprayed layer 20 embedded in the base layer 10, so as to improve uniformity of heat dissipation and overall efficiency of heat conduction.

BENEFICIAL EFFECTS OF THE EMBODIMENTS

In conclusion, in the heat-dissipating substrate structure provided by the present disclosure, by virtue of "the cold spray coating layer being the film formed on the surface of the base layer by spraying the solid-phase metal powder and the high-pressure compressed gas onto the base layer", "the solid-phase metal powder at least including the film-forming powder with the apparent density of 3 to 4 g/cm$^3$ and the median particle diameter (D50) of 30 μm or less", and "the maximum depth of a bottom of the cold spray coating layer embedded in the base layer being 100 µm or less", the bonding strength of the cold spray coating layer 20 and the base layer 10 can reach 40 Mpa or more, and the maximum depth of the bottom of the cold spray coating layer 20 embedded in the base layer 10 is 100 µm or less, such that the depth of the bottom of the cold spray coating layer embedded in the base layer formed by high-pressure spraying on the base layer can be reduced, the bonding strength can still reach 40 Mpa or more, and formation of complex, diverse, and unpredictable microstructures or cracks can be prevented.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A heat-dissipating substrate structure, comprising:
a base layer made of a metal; and
a cold spray coating layer formed on a top surface of the base layer; wherein the cold spray coating layer is a film formed on the top surface of the base layer by spraying a solid-phase metal powder and a high-pressure compressed gas with a pressure of 4 to 6 Mpa onto the base layer; wherein the solid-phase metal powder at least includes a film-forming powder with an apparent density of 3 to 4 $g/cm^3$ and a median particle diameter (D50) of 30 µm or less; wherein a maximum depth of a bottom of the cold spray coating layer embedded in the base layer is less than 60 µm; wherein at least one internal cooling fin is joined to a bottom surface of the base layer, and at least one internal coolant passage is defined between the base layer and the at least one internal cooling fin.

2. The heat-dissipating substrate structure according to claim 1, wherein a predetermined ratio between a thickness of the base layer and a thickness of the cold spray coating layer ranges from 10:1 to 30:1.

3. The heat-dissipating substrate structure according to claim 2, wherein the thickness of the base layer is from 1 mm to 3 mm.

4. The heat-dissipating substrate structure according to claim 1, wherein the at least one internal cooling fin is joined to the bottom surface of the base layer by brazing, adhesive bonding, or solid-state welding.

5. The heat-dissipating substrate structure according to claim 1, wherein the cold spray coating layer is a cold spray copper layer.

6. The heat-dissipating substrate structure according to claim 1, wherein the base layer is an aluminum substrate.

* * * * *